United States Patent [19]

Ibok

[11] Patent Number: 4,894,353
[45] Date of Patent: Jan. 16, 1990

[54] METHOD OF FABRICATING PASSIVATED TUNNEL OXIDE

[75] Inventor: Effiong E. Ibok, Austin, Tex.

[73] Assignee: Advanced Micro Devices, Inc., Sunnyvale, Calif.

[21] Appl. No.: 187,738

[22] Filed: Apr. 29, 1988

[51] Int. Cl.$^4$ .......................................... H01L 21/316
[52] U.S. Cl. ..................................... 437/239; 437/43; 437/49; 437/52; 437/238; 437/243; 427/255.3
[58] Field of Search ...................... 437/43, 49, 52, 235, 437/238, 239, 243, 69; 427/255.1, 255.2, 255.3

[56] References Cited

U.S. PATENT DOCUMENTS

| 4,139,658 | 2/1979 | Cohen et al. | 437/239 |
| 4,377,605 | 3/1983 | Yamamoto | 437/239 |
| 4,518,630 | 5/1985 | Grasser | 437/238 |
| 4,551,910 | 11/1985 | Patterson | 437/69 |
| 4,567,061 | 1/1986 | Hayashi et al. | 437/240 |
| 4,775,642 | 10/1988 | Chang et al. | 437/52 |
| 4,784,975 | 11/1988 | Hofmann et al. | 148/DIG. 4 |

FOREIGN PATENT DOCUMENTS

| 0011069 | 1/1974 | Japan . | |
| 0125966 | 9/1979 | Japan | 437/239 |

OTHER PUBLICATIONS

Steinberg, "Dual HCl Thin Gate Oxidation Process", J. Electrochem. Soc., vol. 129, No. 8, Aug. 1982, pp. 1778-1782.
Bhattacharyya et al., "A Two-Step Oxidation Process to Improve the Electrical Breakdown Properties of Thin Oxides", J. Electrochem. Soc., vol. 132, No. 8, Aug. 1985, pp. 1900-1903.
Hashimoto et al., "A Method of Forming Thin and Highly Reliable Gate Oxides", J. Electrochem. Soc., vol. 127, No. 1, Jan. 1980, pp. 129-135.
Singh et al., "Oxidation of Silicon in the Presence of Chlorine and Chlorine Compounds", J. Electrochem. Soc., vol. 125, No. 3, Mar. 1978, pp. 453-461.
Cohen, "Electrical Properties of Post-Annealed Thin SiO$_2$ Films", J. Electrochem. Soc., vol. 130, No. 4, Apr. 1983, pp. 929-932.
Solomon, "Breakdown in Silicon Oxide—A Review", J. Vac. Sci. Technol., vol. 14, No. 5, Sep./Oct. 1977, pp. 1122-1130.
Roda et al., "A Simplified Viscoelastic Model for the Thermal Growth of Thin SiO$_2$ Films", J. Electrochem. Soc., vol. 132, No. 8, Aug. 1985, pp. 1909-1913.
Faraone et al., "Surface Roughness and Electrical Conduction of Oxide/Polysilicon Interfaces", J. Electrochem. Soc., vol. 133, No. 7, Jul. 1986, pp. 1410-1413.

Primary Examiner—Olik Chaudhuri
Assistant Examiner—M. Wilczewski
Attorney, Agent, or Firm—Fliesler, Dubb, Meyer & Lovejoy

[57] ABSTRACT

A method of fabricating a high-quality tunnel oxide layer includes a two-step oxidation process. The first oxidation step includes oxidizing a substrate in an atmosphere comprising oxygen and nitrogen at a temperature of approximately 950° C., and thus is an HCl-less oxidation. The second oxidation step is performed in an atmosphere comprising HCl and argon at a temperature of approximately 1050° C. The first oxidation step is performed at a temperature in the range of temperatures for the viscous flow of the oxide to prevent any physical defects from forming in the oxide layer. The second oxidation step is performed at a temperature sufficient to passivate any mobile ions in the oxide layer in at atmosphere comprising a gettering agent, for example, HCl. By this two-step oxidation process a tunnel oxide layer which is of high quality and is not damaged during subsequent processing steps performed at temperatures at 1100° C. and above.

16 Claims, 1 Drawing Sheet

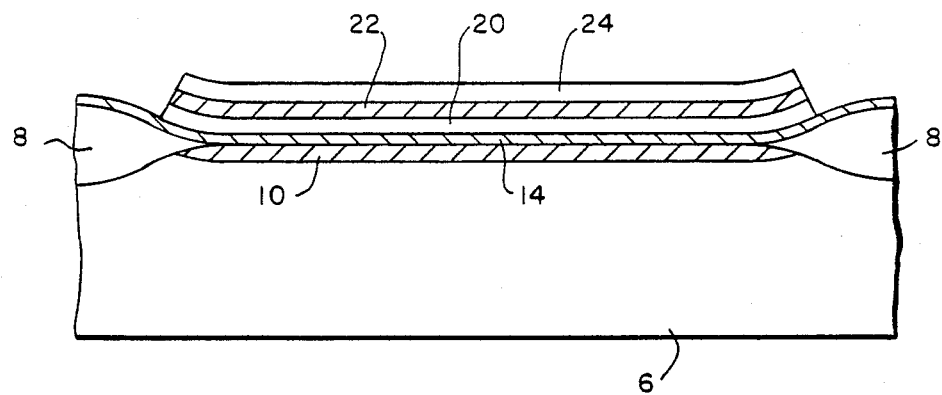
FIG.—1

METHOD OF FABRICATING PASSIVATED TUNNEL OXIDE

BACKGROUND OF THE INVENTION

1. Field of the Invention

The present invention relates to the fabrication of high-quality tunnel oxide layers, and more particularly, to the fabrication of tunnel capacitors.

1. Description of the Related Art

Conventional oxide layers, particularly tunnel oxides for tunnelling EEPROMs, have poor endurance after the oxide layers are heated to temperatures of 1100° C. or more during fabrication steps following the formation of the oxide layer. In particular, in the fabrication of EEPROMs, a tunnel oxide is provided on a substrate and a polysilicon floating gate is deposited on the tunnel oxide and then doped and patterned. Then, an inter-gate oxide is thermally grown at the exposed surface of the control gate at a temperature of 1100° C. or greater. A control gate is provided on the inter-gate oxide.

Several problems may occur with the tunnel oxide in such an EEPROM. First, if the tunnel oxide is grown in a gaseous environment including HCl, the surface of the substrate is roughened due to etching by the HCl. The roughening of the surface of the substrate creates physical discontinuities which cause charge concentrations in the regions of the discontinuities. Charge concentrations if large enough can exceed the breakdown voltage of the tunnel oxide.

Second, conventional tunnel oxides have physical defects, e.g., cracks, which allow the dopant ions in the control gate to migrate across the tunnel oxide to the substrate during the high temperature cycle utilized to grow the inter-gate oxide, thereby ruining the device.

Conventional tunnel oxide layers suffer from a reduction in the breakdown field (breakdown voltage normalized for thickness), low fluence (capacitance normalized for the area of the capacitor), and the inability to be stressed to high breakdown fields without catastrophic failure. These problems also occur with gate oxide layers in EPROMs and other MOS devices.

SUMMARY OF THE INVENTION

It is, therefore, an object of the present invention to provide an improved oxide layer for semiconductor devices.

Another object of the present invention is to provide a method of fabricating an oxide layer without roughening the surface of the substrate on which the oxide layer is formed.

A further object of the present invention is to provide a high-quality oxide layer having a minimum of physical defects.

Another object of the present invention is to provide a method of fabricating an 80 Å tunnel oxide layer having a breakdown field at $1\mu$ of greater than 50 mV/cm with a positive bias on the gate and 15 mV/cm with a negative bias on the gate, and a fluence of greater than 30 C/cm$^2$.

Another object of the present invention is to provide a method of fabricating a tunnel oxide having high reliability after exposures to temperatures of 1100° C. or greater.

The fabrication of a tunnel oxide layer on a substrate in accordance with the present invention comprises the steps of heating the substrate to a temperature between 950° C. and 1000° C. in an atmosphere comprising nitrogen, performing a first oxidation of the substrate at a temperature between 950° C. and 1000° C. in an atmosphere comprising approximately 20% oxygen, heating the substrate to temperature greater than 1000° C. in at atmosphere comprising argon, and performing a second oxidation of the substrate in an atmosphere comprising approximately 3% HCl. The first oxidation is performed at a temperature at which there is a viscous flow of the oxide to prevent physical defects and the second oxidation step passivates mobile ions in the oxide layer.

BRIEF DESCRIPTION OF THE DRAWINGS

FIG. 1 illustrates an EEPROM having a tunnel oxide layer formed in accordance with the method of the present invention.

DESCRIPTION OF THE PREFERRED EMBODIMENT

A method of fabricating a high-quality oxide layer in accordance with the present invention will be described with reference to the EEPROM shown in FIG. 1. It is to be understood that all temperatures, times, and percentages gas compositions are approximate and are intended to be exemplary of temperatures, times, and percentage compositions which achieve the purposes of the steps of the present invention. Further, an improved oxide fabricated in accordance with the method of the present invention is useful as a gate oxide layer in MOS devices other than EEPROMS including but not limited to CMOS and EPROM devices, and semiconductor capacitors.

The EEPROM shown in FIG. 1 is fabricated on a substrate 6 as follows. Field oxide regions 8 are grown on the substrate to define an active region where the EEPROM is to be provided. An N+ region 10 is implanted into the substrate. The source and drain 10, 11 are formed using a relatively deep implant performed at 160 keV to provide a dopant concentration of $5 \times 10^{14}$/cm$^2$. The surface of substrate 6 is then oxidized to form a tunnel oxide 14. A tunnel oxide layer 14 fabricated in accordance with the method of present invention may be, for example, an 80 Å oxide layer having improved reliability, an increased breakdown field, and a higher fluence. The fabrication of tunnel oxide 14 in accordance with the present invention includes a two-step oxidation process. The substrate 6 is placed in a furnace which is evacuated, backfilled with nitrogen, and heated to a temperature in the range of 950° C. to 1000° C. Oxygen is then introduced into the chamber and a first oxidation step, oxidizing the surface of the substrate, is performed. During the first oxidation step the atmosphere in the chamber includes approximately 20% oxygen, but does not include HCl. The temperature is in the range of 950° C. to 1000° C., the preferred temperature being approximately 950° C. The oxidation temperature of 950° C. is chosen because it falls within the range of temperatures for which the oxide exhibits viscous flow, i.e., 950° C.–975° C., and thus minimizes the defect density of the oxide layer. Oxides grown at temperatures below 950° C. are subject to stress deformations and discontinuities.

In the preferred embodiment of the present invention the first oxidation step is performed for a time of approximately ten (10) minutes to grow an oxide having a thickness of approximately 50 Å. The oxide grows at the nearly linear rate of approximately 5 Å/min. Accordingly, the thickness of the oxide grown during the first oxidation step may be varied by selecting the appropriate oxidation time.

Then, the furnace is evacuated, argon is then introduced into the furnace, the temperature in the furnace is raised to above 1000° C., and thereafter HCl (in an oxygen basis) is added to perform a second oxidation step. The furnace atmosphere during the second oxidation step comprises approximately 3% HCl, and the preferred temperature is approximately 1050° C. This second oxidation step is performed to passivate (or getter) any mobile ions which exist in the oxide or at the oxide/silicon interface. The temperature of 1050° C. is selected because it is the minimum temperature needed for passivation. Higher temperatures have been shown to yield minimal improvement. In the preferred embodiment of the present invention the second oxidation step is performed for approximately three (3) minutes to ensure that the etching of the oxide and the substrate by the HCl will be kept to a minimum and provides a tunnel oxide 14 having a thickness of approximately 80 Å. The oxide growth rate is increased during the second oxidation step due to the increased oxidation temperature.

Then, the furnace is again evacuated and backfilled with argon and the substrate and tunnel oxide layer 14 is subjected to an anneal for approximately 15 minutes before the furnace temperature is ramped down.

Following formation of the tunnel oxide 14, a floating gate 20 formed of, for example, doped polysilicon, is provided on the tunnel oxide 14. An inter-gate oxide layer 22 is provided on the surface of floating gate 20. If floating gate 20 is formed of doped polysilicon, inter-gate oxide layer 22 may be formed by oxidizing a portion of floating gate 20; it is this oxidation process, performed at temperatures of 1100° C. and above, which causes diffusion of the dopant ions in floating gate 20 through conventional tunnel oxide layers. A control gate 24 is then provided on inter-gate oxide layer 22.

The EEPROM device may be completed using conventional semiconductor device fabrication techniques to provide contact (not shown) for source 16 and drain 18, interconnects (not shown), and passivation layers (not shown).

Tunnel oxide layers of 80 Å formed in accordance with the present invention have been shown to have breakdown fields at 1μA of greater than 50 mV/cm with a positive bias on the gate, and a fluence of up to 40 C/cm². Further, these oxide layers have been shown to withstand stresses of up to 75 MV/cm over seven (7) repetitions without catastrophic failure.

The many features and advantages of the method of fabricating a passivated tunnel oxide in accordance with the present invention will be apparent to those of ordinary skill in the art. Thus, the following claims are intended to cover all modifications and equivalents falling within the scope of the invention.

I claim:

1. A method of fabricating a high-quality oxide layer on a substrate, comprising the sequential steps of:
    (a) oxidizing the substrate in an atmosphere comprising oxygen and nitrogen at a temperature greater than or equal to 950° C. and less than or equal to 1000° C.; and
    (b) oxidizing the substrate in an atmosphere comprising HCl, oxygen, and argon (Ar) at a temperature greater than 1050° C., said steps (a) and (b) being conducted for times sufficient to form an oxide layer having a total thickness of less than 200 Å.

2. A method according to claim 1, wherein said step (a) comprises oxidizing the substrate in an atmosphere comprising approximately 20% dry oxygen.

3. A method according to claim 2, wherein said step (a) comprises oxidizing the substrate at approximately 950° C.

4. A method according to claim 1, wherein said step (b) comprises oxidizing the substrate in an atmosphere comprising approximately 3% HCl.

5. A method of fabricating a high-quality oxide layer on a substrate, comprising the steps of:
    (a) oxidizing the substrate in an atmosphere comprising oxygen and nitrogen at a temperature greater than or equal to 950° C. and less than or equal to 1000° C.; and
    (b) passivating the mobile ions in the oxide layer formed in said step (a) by exposing the oxide layer to an atmosphere comprising approximately 5% HCl at a temperature greater than 1050° C., said steps (a) and (b) being conducted times sufficient to form a tunnel oxide layer having total thickness of less than 200 Å.

6. A method according to claim 5, wherein said step (a) comprises oxidizing the substrate in an atmosphere comprising approximately 20% dry oxygen and nitrogen.

7. A method according to claim 6, wherein said step (a) comprises oxidizing the substrate at approximately 950° C.

8. A method of fabricating a high-quality tunnel oxide layer having a thickness of less than 150 Å on a substrate, comprising the sequential steps of:
    (a) heating the substrate to greater than approximately 950° C. and less than or equal to 1000° C. in an atmosphere comprising nitrogen ($N_2$);
    (b) oxidizing the substrate in an atmosphere comprising oxygen at the temperature attained in said step (a);
    (c) heating the substrate to a temperature greater than approximately 1050° C. in an atmosphere comprising argon; and
    (d) oxidizing the substrate in an atmosphere comprising oxygen and HCl at the temperature attained in said step (c).

9. A method according to claim 8, wherein said step (b) comprises oxidizing the substrate in an atmosphere comprising approximately 20% oxygen.

10. A method according to claim 10, wherein said step (d) comprises oxidizing the substrate in an atmosphere comprising approximately 3% HCl.

11. A method according to claim 9, wherein said step (d) comprises oxidizing the substrate in an atmosphere comprising approximately 3% HCl.

12. A method according to claim 8, wherein said step (d) comprises passivating the tunnel oxide.

13. A method according to claim 9, further comprising the step (e) of annealing the substrate in argon after said step (d).

14. A method of fabricating an EEPROM having a high-quality tunnel oxide layer on a substrate, comprising the sequential steps of:
    (a) providing source and drain regions in the substrate, said source and drain regions being spaced apart to define a channel therebetween;
    (b) heat the substrate to a temperature greater than approximately 950° C. in an atmosphere comprising nitrogen ($N_2$);

(c) oxidizing the substrate in an atmosphere comprising approximately 20% oxygen at a temperature of approximately 950° C. for a time sufficient to form an oxide layer having a thickness of less than approximately 100 Å;

(d) heating the substrate to a temperature of approximately 1050° C. in an inert atmosphere;

(e) oxidizing the substrate in an atmosphere comprising oxygen and approximately 3% HCl at a temperature of approximately 1050° C. to passivate any mobile ions in the oxide layer for a time sufficient to increase the thickness of the oxide layer to less than approximately 150 Å; and (f) annealing the substrate in an atmosphere comprising argon for approximately 15 minutes.

15. A method according to claim 14, wherein said step (d) comprises heating the substrate in an atmosphere comprising argon to passivate any mobile ions at the oxide/substrate interface.

16. A method according to claim 14, wherein:
said step (c) comprises oxidizing the substrate for approximately 10 minutes to grow a tunnel oxide layer having a thickness of approximately 50 Å; and
said step (e) comprises oxidizing the substrate for approximately 3 minutes, thereby increasing the thickness of the tunnel oxide layer to approximately 80 Å.

* * * * *